(12) United States Patent  (10) Patent No.: US 7,772,668 B2
Pan  (45) Date of Patent: Aug. 10, 2010

(54) SHIELDED GATE TRENCH FET WITH MULTIPLE CHANNELS

(75) Inventor: James Pan, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 146 days.

(21) Appl. No.: 11/964,283

(22) Filed: Dec. 26, 2007

(65) Prior Publication Data

US 2009/0166728 A1 Jul. 2, 2009

(51) Int. Cl.
  *H01L 29/93* (2006.01)
(52) U.S. Cl. .................................. 257/492; 257/E29.257
(58) Field of Classification Search ................. 257/330, 257/331, 492, 493, E29.201, E29.256, E29.257, 257/E29.26, 110, 119, 341, E21.419
  See application file for complete search history.

(56) References Cited

U.S. PATENT DOCUMENTS

| 3,404,295 | A | | 10/1968 | Warner et al. |
|---|---|---|---|---|
| 3,412,297 | A | | 11/1968 | Amlinger |
| 3,497,777 | A | | 2/1970 | Teszner et al. |
| 3,564,356 | A | | 2/1971 | Wilson |
| 3,660,697 | A | | 5/1972 | Berglund et al. |
| 4,003,072 | A | | 1/1977 | Matsushita et al. |
| 4,011,105 | A | | 3/1977 | Paivinen et al. |
| 4,190,853 | A | * | 2/1980 | Hutson ........................ 257/120 |
| 4,216,488 | A | * | 8/1980 | Hutson ........................ 257/110 |
| 4,300,150 | A | | 11/1981 | Colak |
| 4,324,038 | A | | 4/1982 | Chang et al. |
| 4,326,332 | A | | 4/1982 | Kenney et al. |
| 4,337,474 | A | | 6/1982 | Yukimoto |
| 4,345,265 | A | | 8/1982 | Blanchard |

(Continued)

FOREIGN PATENT DOCUMENTS

CN 1036666 10/1989

(Continued)

OTHER PUBLICATIONS

Bulucea "Trench DMOS Transistor Technology for High Current (100 A Range) Switching" Solid-State Electronics vol. 34 pp. 493-507 May 1991.

(Continued)

*Primary Examiner*—Minh-Loan T Tran
*Assistant Examiner*—Vongsavanh Sengdara
(74) *Attorney, Agent, or Firm*—Townsend and Townsend and Crew LLP

(57) ABSTRACT

A field effect transistor (FET) includes a pair of trenches extending into a semiconductor region. Each trench includes a first shield electrode in a lower portion of the trench and a gate electrode in an upper portion of the trench over but insulated from the shield electrode. First and second well regions of a first conductivity type laterally extend in the semiconductor region between the pair of trenches and abut sidewalls of the pair of trenches. The first and second well regions are vertically spaced from one another by a first drift region of a second conductivity type. The gate electrode and the first shield electrode are positioned relative to the first and second well regions such that a channel is formed in each of the first and second well regions when the FET is biased in the on state.

22 Claims, 11 Drawing Sheets

U.S. PATENT DOCUMENTS

| | | |
|---|---|---|
| 4,445,202 A | 4/1984 | Geotze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A * | 3/1994 | Okada ..................... 257/409 |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,454,435 A | 7/1995 | Baliga |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi et al. |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyed et al. |
| 5,593,909 A | 1/1997 | Han et al. |
| 5,595,927 A | 1/1997 | Chen et al. |
| 5,597,765 A * | 1/1997 | Yilmaz et al. ............... 438/270 |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi et al. |
| 5,719,409 A | 2/1998 | Singh et al. |
| 5,744,372 A | 4/1998 | Bulucea |
| 5,763,915 A * | 6/1998 | Hshieh et al. ............... 257/330 |
| 5,767,004 A | 6/1998 | Balasurbramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyed et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |

| | | |
|---|---|---|
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A * | 11/1999 | Hshieh et al. ............... 438/270 |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Fresart et al. |
| 6,087,232 A | 7/2000 | Kim et al. |
| 6,096,608 A | 8/2000 | Williams |
| 6,097,063 A * | 8/2000 | Fujihira ...................... 257/339 |
| 6,103,578 A | 8/2000 | Uenishi et al. |
| 6,103,619 A | 8/2000 | Lai |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,531 B2 | 10/2001 | Armacost et al. |
| 6,297,534 B1 | 10/2001 | Kawaguchi et al. |
| 6,303,969 B1 | 10/2001 | Tan |
| 6,307,246 B1 | 10/2001 | Nitts et al. |
| 6,309,920 B1 | 10/2001 | Laska et al. |
| 6,313,482 B1 | 11/2001 | Baliga |
| 6,313,513 B1 * | 11/2001 | Imanishi et al. ............. 257/401 |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,413,822 B2 * | 7/2002 | Williams et al. ............ 438/270 |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,441,454 B2 | 8/2002 | Hijzen et al. |
| 6,444,574 B1 | 9/2002 | Chu |
| 6,452,230 B1 | 9/2002 | Boden, Jr. |
| 6,461,918 B1 | 10/2002 | Calafut |
| 6,462,376 B1 * | 10/2002 | Wahl et al. .................. 257/331 |
| 6,465,304 B1 | 10/2002 | Blanchard |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,534,825 B2 | 3/2003 | Calafut |
| 6,545,297 B1 * | 4/2003 | Noble et al. ................. 257/124 |
| 6,566,709 B2 * | 5/2003 | Fujihira ...................... 257/339 |
| 6,566,804 B1 | 5/2003 | Trujillo et al. |
| 6,580,123 B2 | 6/2003 | Thapar |
| 6,608,350 B2 | 8/2003 | Kinzer et al. |
| 6,657,254 B2 | 12/2003 | Hshieh et al. |
| 6,677,641 B2 | 1/2004 | Kocon |
| 6,683,346 B2 | 1/2004 | Zeng |
| 6,690,062 B2 * | 2/2004 | Henninger et al. .......... 257/340 |
| 6,710,403 B2 | 3/2004 | Sapp |
| 6,720,615 B2 * | 4/2004 | Fujihira ...................... 257/328 |
| 6,720,616 B2 | 4/2004 | Hirler et al. |
| 6,734,066 B2 | 5/2004 | Lin et al. |
| 6,762,127 B2 | 7/2004 | Boiteux et al. |
| 6,806,533 B2 | 10/2004 | Henninger et al. |

| | | | |
|---|---|---|---|
| 6,815,293 B2 | 11/2004 | Disney et al. | |
| 6,833,584 B2 | 12/2004 | Henninger et al. | |
| 6,835,993 B2 * | 12/2004 | Sridevan et al. | 257/492 |
| 7,091,557 B2 * | 8/2006 | Deboy | 257/339 |
| 7,126,166 B2 * | 10/2006 | Nair et al. | 257/110 |
| 7,183,610 B2 * | 2/2007 | Pattanayak et al. | 257/333 |
| 7,186,618 B2 * | 3/2007 | Polzl et al. | 438/270 |
| 7,268,395 B2 * | 9/2007 | Qu | 257/342 |
| 7,355,224 B2 * | 4/2008 | Cai | 257/260 |
| 7,372,111 B2 * | 5/2008 | Onishi et al. | 257/401 |
| 7,393,749 B2 * | 7/2008 | Yilmaz et al. | 438/259 |
| 7,427,800 B2 * | 9/2008 | Yilmaz | 257/488 |
| 2001/0023961 A1 | 9/2001 | Hshieh et al. | |
| 2001/0026989 A1 | 10/2001 | Thapar | |
| 2001/0028083 A1 | 10/2001 | Onishi et al. | |
| 2001/0032998 A1 | 10/2001 | Iwamoto et al. | |
| 2001/0041400 A1 | 11/2001 | Ren et al. | |
| 2001/0049167 A1 | 12/2001 | Madson | |
| 2001/0050394 A1 | 12/2001 | Onishi et al. | |
| 2002/0008284 A1 | 1/2002 | Zeng | |
| 2002/0009832 A1 | 1/2002 | Blanchard | |
| 2002/0014658 A1 | 2/2002 | Blanchard | |
| 2002/0066924 A1 | 6/2002 | Blanchard | |
| 2002/0070418 A1 | 6/2002 | Kinzer et al. | |
| 2002/0100933 A1 | 8/2002 | Marchant | |
| 2003/0060013 A1 | 3/2003 | Marchant | |
| 2003/0073287 A1 * | 4/2003 | Kocon | 438/259 |
| 2003/0132450 A1 | 7/2003 | Minato et al. | |
| 2003/0178676 A1 * | 9/2003 | Henninger et al. | 257/340 |
| 2003/0193067 A1 | 10/2003 | Kim | |
| 2003/0209757 A1 | 11/2003 | Henninger et al. | |
| 2004/0016963 A1 * | 1/2004 | Baliga | 257/330 |
| 2004/0031987 A1 | 2/2004 | Henninger et al. | |
| 2004/0089910 A1 | 5/2004 | Hirler et al. | |
| 2004/0121572 A1 | 6/2004 | Darwish et al. | |
| 2004/0232407 A1 | 11/2004 | Calafut | |
| 2005/0017293 A1 | 1/2005 | Zundel et al. | |
| 2005/0082591 A1 * | 4/2005 | Hirler et al. | 257/302 |
| 2005/0145936 A1 * | 7/2005 | Polzl et al. | 257/341 |
| 2005/0167742 A1 * | 8/2005 | Challa et al. | 257/328 |
| 2005/0242392 A1 * | 11/2005 | Pattanayak et al. | 257/328 |
| 2006/0273386 A1 * | 12/2006 | Yilmaz et al. | 257/330 |
| 2007/0032020 A1 | 2/2007 | Grebs et al. | |
| 2007/0114600 A1 * | 5/2007 | Hirler et al. | 257/330 |
| 2007/0138544 A1 * | 6/2007 | Hirler et al. | 257/330 |
| 2007/0138546 A1 * | 6/2007 | Kawamura et al. | 257/330 |
| 2007/0181939 A1 * | 8/2007 | Huang et al. | 257/330 |
| 2007/0194374 A1 * | 8/2007 | Bhalla et al. | 257/330 |
| 2007/0221952 A1 * | 9/2007 | Thorup et al. | 257/155 |
| 2008/0017920 A1 * | 1/2008 | Sapp et al. | 257/330 |
| 2008/0138953 A1 * | 6/2008 | Challa et al. | 438/270 |
| 2008/0182376 A1 * | 7/2008 | Pattanayak et al. | 438/270 |
| 2008/0211014 A1 * | 9/2008 | Zeng | 257/330 |
| 2008/0290405 A1 * | 11/2008 | Lu | 257/330 |
| 2009/0008709 A1 * | 1/2009 | Yedinak et al. | 257/331 |
| 2009/0090966 A1 * | 4/2009 | Thorup et al. | 257/328 |
| 2009/0111231 A1 * | 4/2009 | Grebs et al. | 438/270 |
| 2009/0121285 A1 * | 5/2009 | Kawamura et al. | 257/330 |
| 2009/0173993 A1 * | 7/2009 | Andrews et al. | 257/330 |
| 2009/0191678 A1 * | 7/2009 | Yilmaz et al. | 438/270 |
| 2009/0194811 A1 * | 8/2009 | Pan et al. | 257/330 |
| 2009/0200606 A1 * | 8/2009 | Yilmaz et al. | 257/330 |
| 2009/0206401 A1 * | 8/2009 | Hirler et al. | 257/333 |
| 2010/0038710 A1 * | 2/2010 | Ohtani et al. | 257/330 |

FOREIGN PATENT DOCUMENTS

| | | |
|---|---|---|
| DE | 4300806 | 12/1993 |
| DE | 19736981 | 8/1998 |
| EP | 975024 | 1/2000 |
| EP | 1026749 | 9/2000 |
| EP | 1054451 | 11/2000 |
| EP | 747967 | 2/2002 |
| EP | 1205980 | 5/2002 |
| JP | 56-058267 | 5/1981 |
| JP | 62-069562 | 3/1987 |
| JP | 63-186475 | 8/1988 |
| JP | 63-288047 | 11/1988 |
| JP | 64-022051 | 1/1989 |
| JP | 2000-040822 | 2/2000 |
| JP | 2000-040872 | 2/2000 |
| JP | 2000-156978 | 6/2000 |
| JP | 2000-277726 | 10/2000 |
| JP | 2000-277728 | 10/2000 |
| JP | 2001-015448 | 1/2001 |
| JP | 2001-015752 | 1/2001 |
| JP | 2001-102577 | 4/2001 |
| JP | 2001-111041 | 4/2001 |
| JP | 2001-135819 | 5/2001 |
| JP | 2001-144292 | 5/2001 |
| JP | 2001-192174 | 7/2001 |
| JP | 2001-244461 | 9/2001 |
| JP | 2001-313391 | 11/2001 |
| JP | 2002-083976 | 3/2002 |
| JP | 2005-226638 | 8/2005 |
| WO | 00/33386 | 6/2000 |
| WO | 00/68997 | 11/2000 |
| WO | 00/68998 | 11/2000 |
| WO | 00/75965 | 12/2000 |
| WO | 01/06557 | 1/2001 |
| WO | 0106550 | 1/2001 |
| WO | 01/45155 | 6/2001 |
| WO | 01/59847 | 8/2001 |
| WO | 01/71815 | 9/2001 |
| WO | 01/95385 | 12/2001 |
| WO | 01/95398 | 12/2001 |
| WO | 0201644 | 1/2002 |
| WO | 02/47171 | 6/2002 |

OTHER PUBLICATIONS

"CoolMOS the second generation," Infineon Technologies Product Information, 2 pages total, (2000).

"IR develops CoolMOS—Equivalent Technology, Positions it at the top of a 3-Tiered Line of New Products for SMPS," International Rectifiers Company Information Available at http://www.irf.com, 3 pages total, (1999).

Baliga "New Concepts in Power Rectifiers." Physics of Semiconductor Devices, Proceedings of the Third Int'l Workshop, Madras (India). Committee on Science and Technology in Developing Countries, pp. 471-481(1985).

Baliga "Options for CVD of Dielectrics Include Low-k Materials." Technical Literature from Semiconductor International 4 pages total, Jun. 1998.

Baliga et al. "Improving the Reverse Recovery of Power MOSFET Integral Diodes by Electron Irradiation," Solid State Electronics, vol. 26, No. 12, pp. 1133-1141, Dec. 1983.

Brown et al. Novel Trench Gate Structure Developments Set the Benchmark for Next Generation Power MOSFET Switching Performance. Power Electronics—Proceedings (PCIM), Nurenburg, Vo.47. pp. 275-278, May 2003.

Chang et al. Numerical and Experimental Analysis of 500-V Power DMOSFET with an Atomic-Lattice Layout IEEE Transactions on Electron Devices 36:2623 Jun. 1989.

Chang et al. "Self-Aligned UMOSFET's with a Specific On-Resistance of 1mQ cm2," IEEE Transactions on Electron Devices 34:2329-2334 Nov. 1987.

Cheng et al. "Fast Reverse Recovery Body Diode in High-Voltage VDMOSFET Using Cell-Distributed Schottky Contacts," IEEE Transactions on Electron Devices, vol. 50, No. 5, pp. 1422-1425, May 2003.

Curtis et al. "APCVD TEOS: 03 Advanced Trench Isolation Applications," Semiconductor Fabtech 9th Edition, 8 pages total, (1999).

Darwish et al. "A New Power W-Gated Trench MOSFET (WMOSFET) with High Switching Performance." ISPSD Proceedings—Cambridge, 4 pages total, Apr. 2003.

Djekic, O et al. "High Frequency Synchronous Buck Converter for Low Voltage Applications," Proc. IEEE Power Electronics Specialist Conf. (PESC), pp. 1248-1254, (1998).

Fujihira "Theory of Semiconductor Super Junction Devices," Jpn. J. Appl. Phys. vol. 36 pp. 6254-6262, Oct. 1997.

Gan et al. "Poly Flanked VDMOS (PFVDMOS): A Superior Technology for Super Junction Devices." IEEE Power Electronics Specialists Conf., Jun. 17-22, 2001, Vancouver, Canada, 4 pages total, (2001).

Glenn et al. "A Novel Vertical Deep Trench Resurf DMOS (VTR-DMOS)" IEEE ISPD, pp. 197-200, Toulouse France, May 22-25, 2000.

Kao et al. "Two Dimensional Thermal Oxidation of Silicon-1. Experiments." IEEE Transactions on Electron Devices, vol. ED-34 No. 5, pp. 1008-1017, May 1987.

Kao et al. "Two Dimensional Thermal Oxidation of Silicon-II Modeling Stress Effects in Wet Oxides." IEEE Transactions on Electron Devices, vol. ED-35 No. 1, pp. 25-37, Jan. 1988.

Kassakian, J.G. et al. "High-Frequency High-Density Converters for Distributed Power Supply Systems," Proc. of the IEEE, vol. 76, No. 4, pp. 362-376, (Apr. 1988).

Korman, C.S. et al. "High Performance Power DMOSFET With Integrated Schottky Diode," Proc. Idée Power Electronics Specialist Conf. (PESC), pp. 176-179, (1989).

Lorenz et al. "Cool MOS—An Important Milestone Towards a New Power MOSFET Generation" Power Conversion pp. 151-160, May 1988.

Maksimovic, A.M. et al. "Modeling and Simulation of Power Electronic Converters," Proc. Of the IEEE, vol. 89, No. 6, pp. 898-912, Jun. 2001.

Mehrotra, M. et al. "Very Low Forward Drop JBS Rectifiers Fabricated Using Submicron Technology," IEEE Transactions on Electron Devices, vol. 40, No. 11, pp. 2131-2132, Nov. 1993.

Miller, "Power Management & Supply—Market, Applications Technologies—an Overview," Infineon Technologies, http://www.ewh.ieee.org/r8.germany/ias-pels/m_regensburg/overview_miller.pdf, 53 pages total, available as early as (May 5, 2003).

Moghadam "Delivering Value Around New Industry Paradigms," Technical Literature From Applied Materials, vol. 1, Issue 2, pp. 1-11, Nov. 1999.

Park et al. "Lateral Trench Gate Super-Junction SOI-LDMOSFETs With Low On-Resistance," Institute for Microelectronics, University of Technology Vienna, Austria, pp. 283-285, (2002).

Sakai et al. "Experimental Investigation of Dependence of Electrical Characteristics of Device Parameters in Trench MOS Barrier, Schottky Diodes," International Symposium on Power Semiconductors and ICs, Technical Digest, pp. 293-296, (1998).

Shenai et al. "Current Transport Mechanisms in Automatically Abrupt Metal-Semiconductor Interfaces," IEEE Transactions on Electron Devices, vol. 35, No. 4, pp. 468-482, (Apr. 1988).

Shenai et al. "Monolithically Integrated Power MOSFET and Schottky Diodes with Improved Reverse Recovery Characteristics," IEEE Transactions on Electron Devices, vol. 37, No. 4, pp. 1167-1169, (Apr. 1990).

Shenoy et al. "Analysis of the Effect of Change Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al. "A MOSFET Resonant Synchronous Rectifier for High-Frequency DC/DC Converters," Proc. IEEE Power Electronics Specialist Conf. (PESC), pp. 769-779, (1990).

Technical Literature From Quester Technology, Model APT-4300 300mm Atmospheric TEOS/Ozone CVD System, 3 pages total, (unknown date).

Technical Literature From Quester Technology, Model APT-6000 Atmospheric TEOS/Ozone CVD System, 2 pages total (unknown date).

Technical Literature From Silicon Valley Group Thermal Systems, APNext, High Throughput APCVD Cluster Tool for 200mm/300mm Wafer Processing, 2 pages total (unknown date).

Tu et al. "On the Reverse Blocking Characteristics of Schottky Power Diodes," IEEE Transactions on Electron Devices, vol. 39, No. 12, pp. 2813-2814, (Dec. 1992).

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf "Silicon Processing for the VLSI Era" vol. 1 Process Technology, Second Edition, pp. 658, (1990).

Yamashita et al. Conduction Power Loss in MOSFET Synchronous Rectifier With Parallel-Connected Schottky Barrier Diode, IEEE Transactions on Power Electronics, vol. 13, No. 4, pp. 667-673, (Jul. 1998).

Wolf "Silicon Processing for the VLSI Era" vol. 2 Process Integration Lattice Press, 3 pages total, (1990).

Office Action in U.S. Appl. No. 10/951,259 Dated Apr. 24, 2007.

Office Action in U.S. Appl. No. 10/951,259 Dated Nov. 28, 2007.

International Search Report of the International Searching Authority for Application No. PCT/US2008/086854, mailed Feb. 19, 2009, 2 pages.

Written Opinion of the International Searching Authority for Application No. PCT/US2008/086854, mailed Feb. 19, 2009, 8 pages.

* cited by examiner

SHIELDED GATE TRENCH FET WITH MULTIPLE CHANNELS

BACKGROUND OF THE INVENTION

The present invention relates in general to semiconductor technology, and more particularly to structures and methods for forming shielded gate trench FETs having multiple channels along each trench sidewall.

Shielded gate trench field effect transistors (FETs) are advantageous over conventional FETs in that the shield electrode reduces the gate-drain capacitance (Cgd) and improves the breakdown voltage of the transistor without sacrificing the transistor on-resistance. FIG. 1 is a simplified cross-sectional view of a conventional shielded gate trench MOSFET 100. N-type epitaxial layer 102 extends over highly doped n-type substrate 101. Substrate 101 serves as the drain contact region. Highly doped n-type source regions 108 and highly doped p-type heavy body regions 106 are formed in p-type well region 104 which is in turn formed in epitaxial layer 102. Trench 110 extends through well region 104 and terminates in the portion of epitaxial layer 102 bounded by well region 104 and substrate 101, which is commonly referred to as the drift region.

Trench 110 includes shield electrode 114 below gate electrode 122. Gate electrode 122 is insulated from well region 104 by gate dielectric 120. Shield electrode 114 is insulated from the drift region by shield dielectric 115. Gate and shield electrodes 122,114 are insulated from each other by interelectrode dielectric (IED) layer 116. IED layer 116 must be of sufficient quality and thickness to support the difference in potential that may exist between shield electrode 114 and gate electrode 122 during operation. Dielectric cap 124 overlays gate electrode 122 and serves to insulate gate electrode 122 from topside interconnect layer 126. Topside interconnect layer 126 extends over the structure and makes electrical contact with heavy body regions 106 and source regions 108.

While inclusion of shield electrode 114 under gate electrode 122 has improved certain performance characteristics of the transistor (such as the breakdown voltage and Cgd), further improvements in these and other electrical and structural characteristics (such as the transistor on-resistance Rdson and unclamped inductive switching UIS characteristic) have been difficult to achieve. This is because, most known techniques for improving certain electrical characteristics of the FET often adversely impact other electrical characteristics or require significant changes to the process technology.

Thus, there is a need for cost effective techniques where various electrical characteristics of a trench gate FET can be improved without compromising other electrical characteristics.

BRIEF SUMMARY OF THE INVENTION

A field effect transistor (FET) includes a pair of trenches extending into a semiconductor region. Each trench includes a first shield electrode in a lower portion of the trench and a gate electrode in an upper portion of the trench over but insulated from the shield electrode. First and second well regions of a first conductivity type laterally extend in the semiconductor region between the pair of trenches and abut sidewalls of the pair of trenches. The first and second well regions are vertically spaced from one another by a first drift region of a second conductivity type. The gate electrode and the first shield electrode are positioned relative to the first and second well regions such that a channel is formed in each of the first and second well regions when the FET is biased in the on state.

In one embodiment, when the FET is biased in the on state, two separate channels are formed along portions of each trench sidewall where the first and second well regions abut.

In another embodiment, the first well region is laterally directly next to the gate electrode in each trench, and the second well region is laterally directly next to the first shield electrode in each trench.

In another embodiment, the first well region is above the second well region. The FET further includes a third well region of the first conductivity type laterally extending in the semiconductor region between the pair of trenches. The third well region abuts sidewalls of the pair of trenches, and is vertically spaced from the second well region by a second drift region of the second conductivity type.

In yet another embodiment, the first well region is above the second well region. The FET further includes a third well region of the first conductivity type laterally extending in the semiconductor region between the pair of trenches. The third well region abuts sidewalls of the pair of trenches and is vertically spaced from the second well region by a second drift region of the second conductivity type. A second shield electrode is disposed in the trench below the first shield electrode. The first and second shield electrodes are insulated from one another.

In accordance with another embodiment of the invention, a method of forming a FET includes the following steps. A pair of trenches extending into a semiconductor region of a first conductivity type is formed. A shield electrode is formed in a lower portion of each trench. A gate electrode is formed in an upper portion of each trench over but insulated from the shield electrode. First and second well regions of a second conductivity type are formed in the semiconductor region between the pair of trenches such that the first and second well regions are vertically spaced from one another and laterally abut sidewalls of the pair of trenches. The gate electrode and the first shield electrode are formed relative to the first and second well regions such that a channel is formed in each of the first and second well regions when the FET is biased in the on state.

In one embodiment, the first well region is laterally directly next to the gate electrode in each trench, and the second well region is laterally directly next to the first shield electrode in each trench.

In another embodiment, the method further includes the following steps. A shield dielectric lining lower sidewalls and bottom of each trench is formed. A gate dielectric lining upper sidewalls of each trench is formed. Source regions of the second conductivity type flanking upper sidewalls of each trench are formed. A heavy body region of the first conductivity type extending in the first well region is formed.

In yet another embodiment, the first well region extends over the second well region, and the first region is formed before the second well region.

In still another embodiment, the first well region extends over the second well region, and the method further includes the stop of forming a third well region of the first conductivity type in the semiconductor region between the pair of trenches. The third well region abuts sidewalls of the pair of trenches and is vertically spaced from the second well region.

Further features of the invention, its nature and various advantages will be more apparent from the accompanying drawings and the following detailed description of embodiments of the invention.

DETAILED DESCRIPTION OF THE INVENTION

In accordance with embodiments of the present invention, shielded gate trench FETs having multiple channels along each trench sidewall and methods of manufacturing the same are described. As will be seen, such FETs substantially improve upon certain performance characteristics of prior art FET structures without sacrificing other performance characteristics of the transistor. These improvements include higher BVdss, lower Rdson, lower gate charge, and improved UIS and snap back characteristic. A first exemplary embodiment of the invention will be described with reference to FIG. 2A.

Figure 2A:
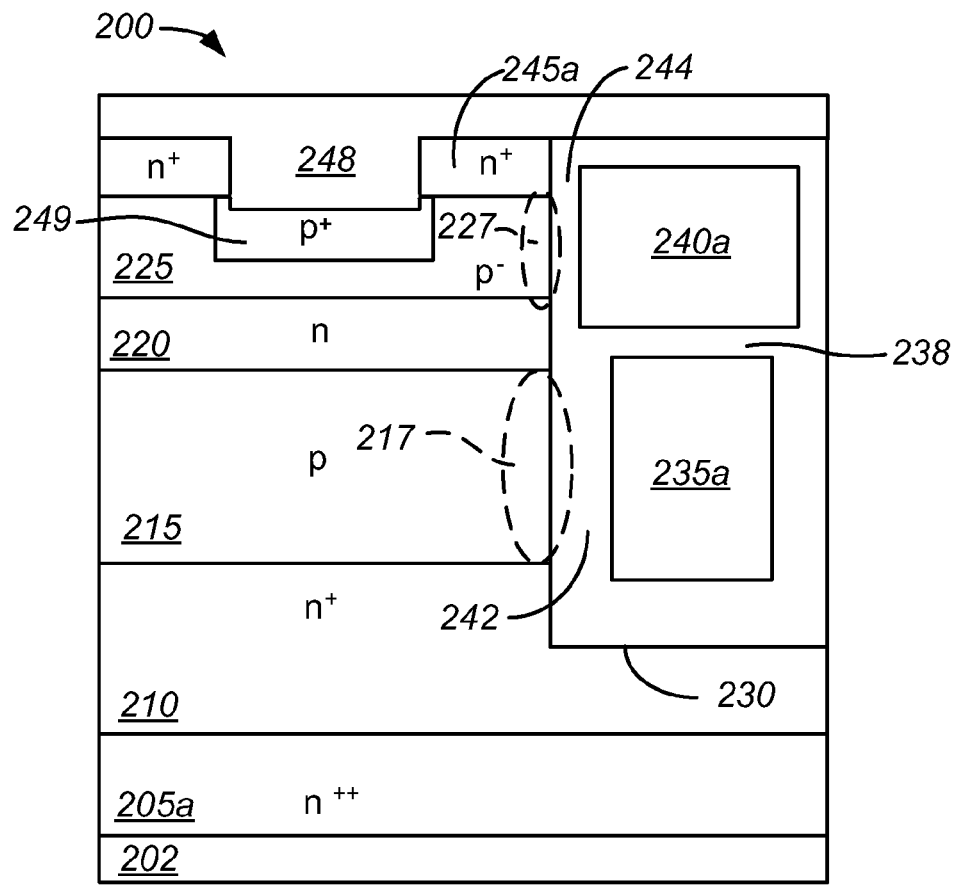
FIG. 2A is a simplified cross-section view of a dual channel shielded gate MOSFET in accordance with an exemplary embodiment of the invention.

FIG. 2A is a simplified cross-section view of a dual channel shielded gate power MOSFET in accordance with an exemplary embodiment of the invention. A lower drift region 210 extends over a semiconductor substrate 205a. Both lower drift region 210 and substrate 205a are n-type. A p-type shield well region 215 overlies lower drift region 210. An upper drift region 220 of n-type conductivity overlies shield well region 215. A gate well region 225 of p-type conductivity overlies upper drift region 220.

Lower drift region 210, shield well region 215, upper drift region 220 and gate well region 225 form a semiconductor stack. Trench 230 extends through this semiconductor stack and terminates within lower drift region 210. Highly doped n-type source regions 245a extend in gate well region 225 and flank upper trench sidewalls. Highly doped p-type heavy body region 249 extends in gate well region 249 between adjacent source regions 245a.

Trench 230 includes shield dielectric layer 242 (e.g., comprising one or both oxide and nitride layers) lining lower sidewalls and bottom of trench 230. Shield electrode 235a (e.g., comprising doped or undoped polysilicon) is disposed in a lower portion of trench 230. Shield electrode 235a is insulated from the adjacent semiconductor regions by shield dielectric 242. In one embodiment, shield dielectric 242 has a thickness in the range of 300-1,000 Å.

An inter-electrode dielectric 238 (e.g., comprising oxide) laterally extends over shield electrode 235a. A gate dielectric 244 (e.g., comprising gate oxide) lines the upper trench sidewalls. In one embodiment, gate dielectric 244 and IED 238 are of the same thickness. In another embodiment, IED 238 is thicker than gate dielectric. A recessed gate electrode 240a (e.g., comprising doped or undoped polysilicon) is disposed over IED 238 in an upper portion of trench 230. A topside interconnect layer 248 electrically contacts source regions 245a and heavy body region 249. A backside interconnect layer 202 electrically contacts the bottom surface of substrate 205a. In one embodiment, the topside and backside interconnect layers 248, 249 comprise a metal.

As can be seen, shielded gate FET 200 is structurally similar in many respects to conventional shielded gate FETs except that an additional well region 215 is embedded in the drift region adjacent to shield electrode 235a. Because of the proximity of well region 215 to shield electrode 235a, well region 215 is herein referred to as "shield well region," and because of the proximity of well region 225 to gate electrode 240a, well region 225 is herein referred to as the "gate well region." Shield well region 215 laterally extends the full width of the mesa region and abuts sidewalls of two adjacent trenches, thus breaking up the drift region into an upper drift region 220 and a lower drift region 210.

Figure 2B:
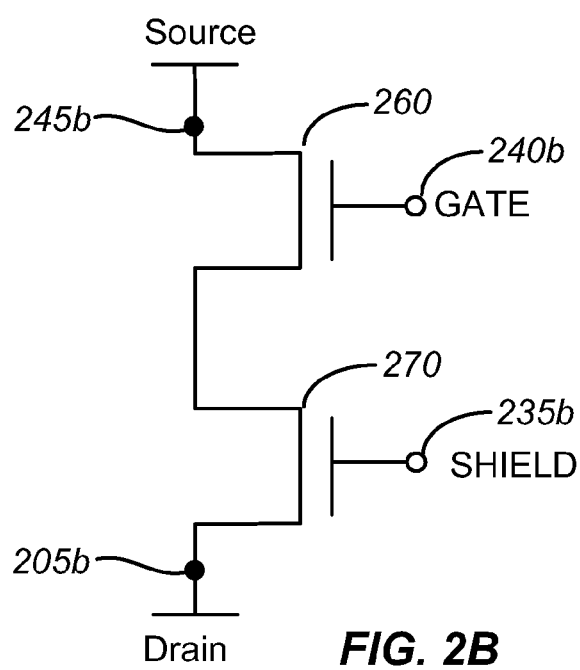
FIG. 2B is an circuit equivalent of the MOSFET in FIG. 2A.

During operation, with source regions 245a and drain region 205a biased to proper voltages, upon applying an appropriate positive voltage to each of gate electrode 240a ad shield electrode 235a, channels 244 and 217 are respectively formed in gate well region 225 and shield well region 215 along the trench sidewalls. Thus, a current path is formed between source regions 245a and drain region 205a through gate well region 227, upper drift region 220, shield well region 215 and lower drift region 210. By embedding shield well region 215 in the drift region directly next to shield electrode 235a, in effect, two transistors serially connected between the drain and source regions are formed. This is more clearly shown in the equivalent circuit diagram in FIG. 2B. In FIG. 2B, gate terminal 240b of upper transistor 260, shield terminal 235b of lower transistor 270, source terminal 245b, and drain terminal 205b correspond to gate electrode 240a, shield electrode 235a, source regions 245a and drain region 205a in FIG. 2A, respectively.

Figure 3A:
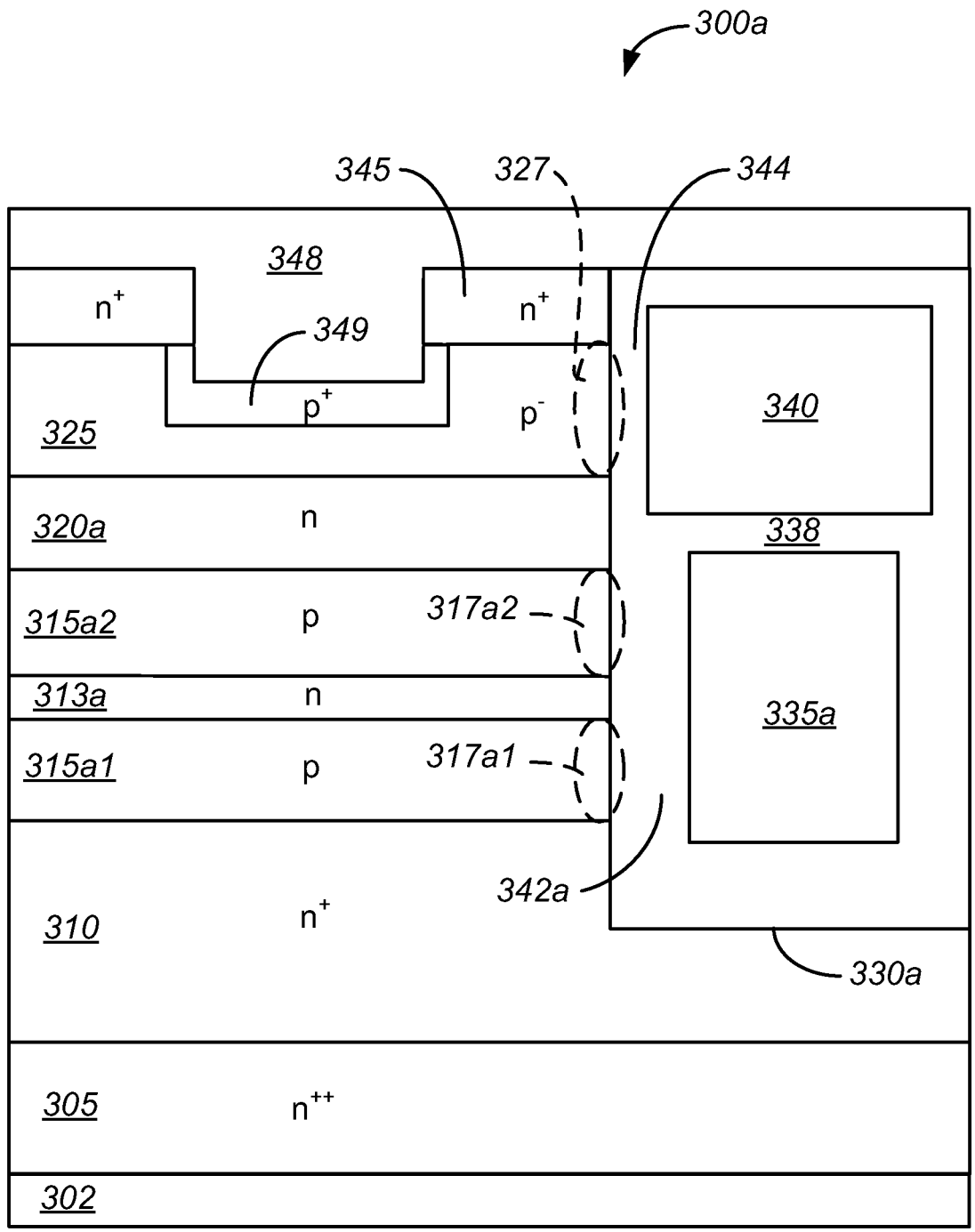
FIGS. 3A-3C are simplified cross-section views of various multiple channel shielded gate trench MOSFETs in accordance with exemplary embodiments of the invention.
Figure 3B:
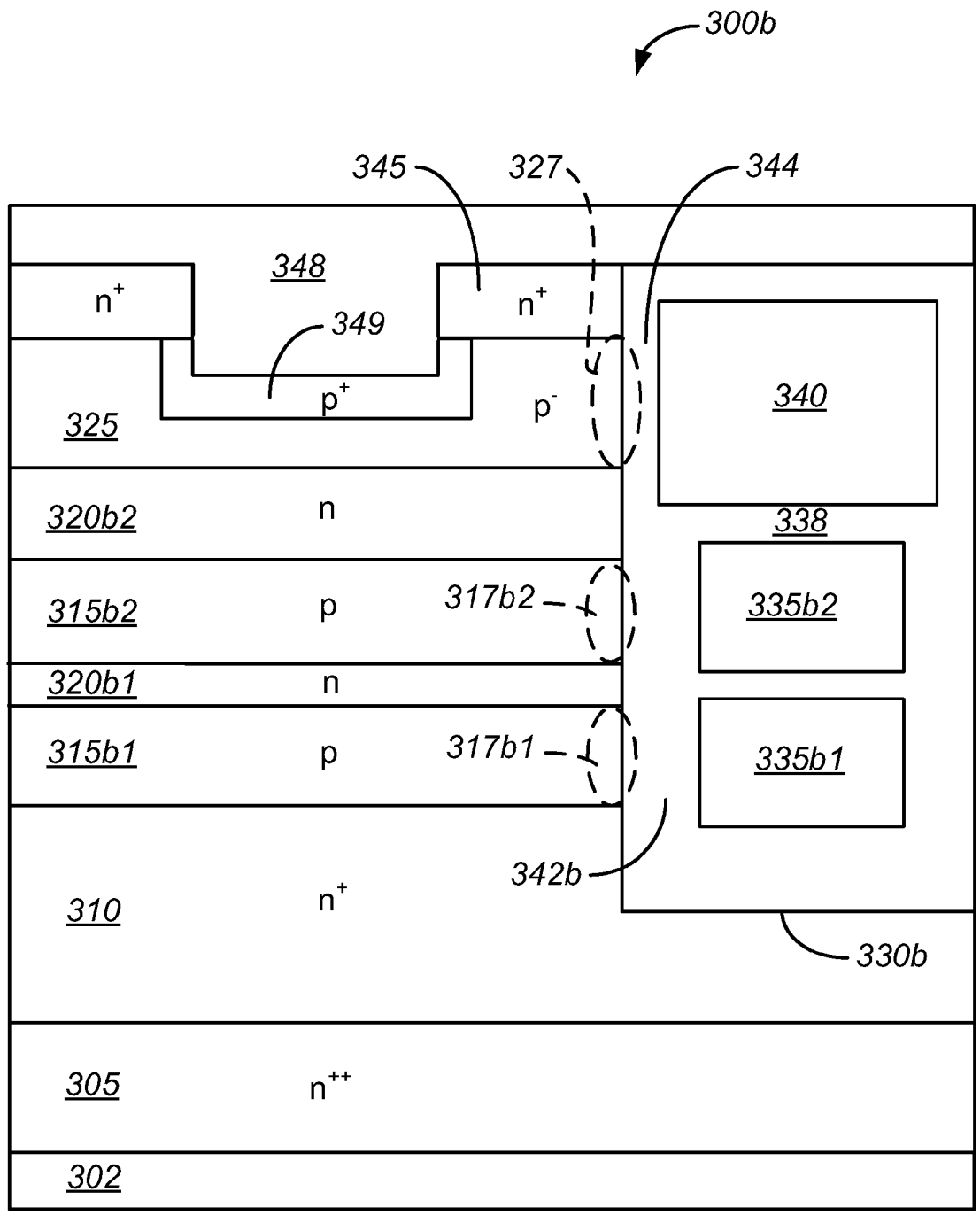
Figure 3C:
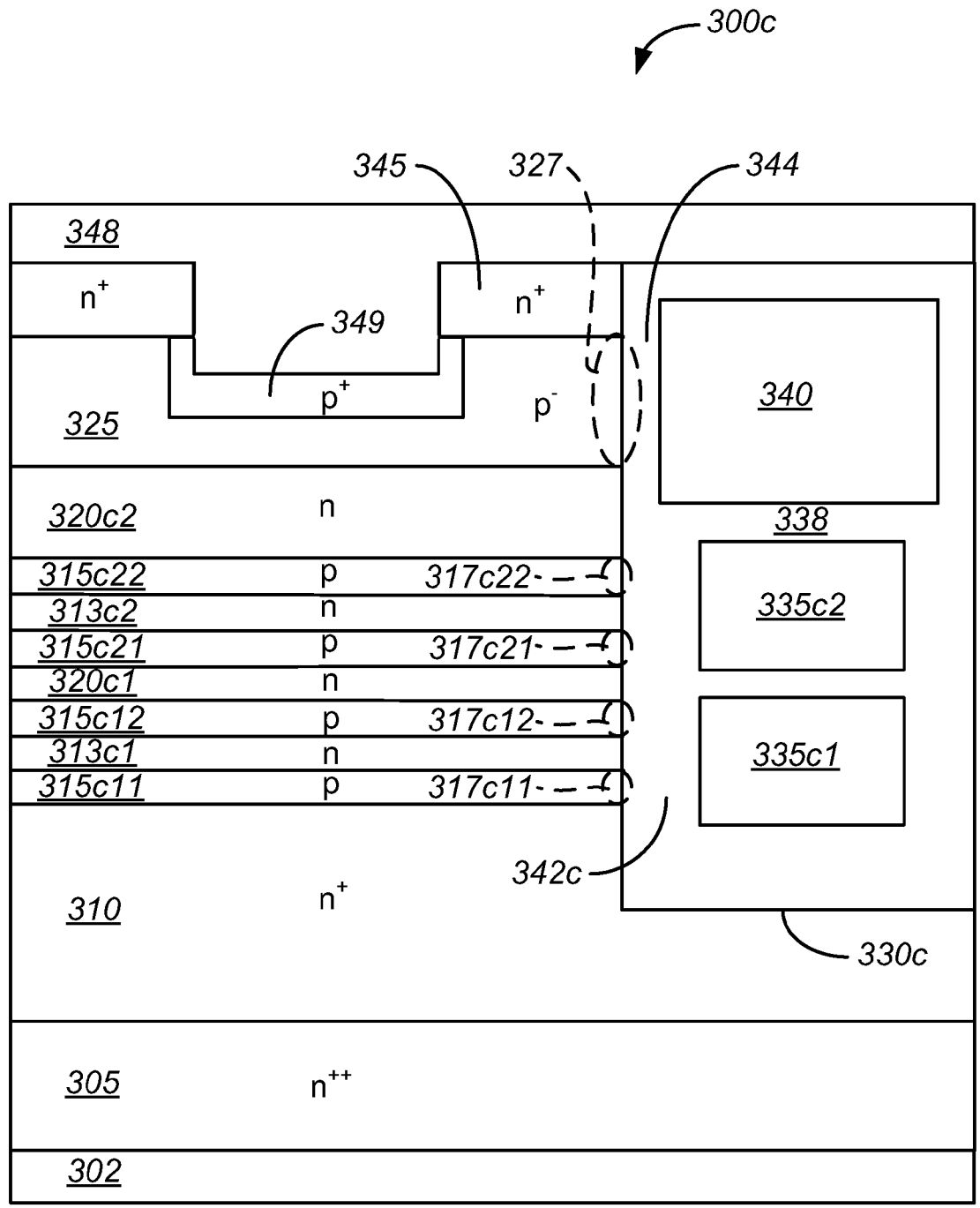

FIGS. 3A-3C are cross section views of three exemplary variations of the dual channel shielded gate FET in FIG. 2A. FET 300a in FIG. 3A is similar to FET 200 in FIG. 2A except that two shield well regions 315a1, 315a2 are embedded in the drift region instead of one. Both shield well regions 315a1, 315a2 are directly next to shield electrode 335a and thus, a channel is formed in each of shield well regions 315a1 and 315a2 when FET 300 is turned with a positive voltage applied to shield electrode 335a. Accordingly, a total of three channels 317a1, 317a2, 327 are formed along each trench sidewall when FET 300a is turned on. Note that the two shield well regions 315a1, 315a2 breakup the drift region into three regions: upper drift region 320a, middle drift region 313a, and lower drift region 310.

FET 300b in FIG. 3B is similar to FET 300a in FIG. 3A except that two shield electrodes 335b1, 335b2 are disposed in trench 330b instead of one. Each of the shield electrodes 335b1 and 335b2 has a corresponding shield well region 315b1, 315b2 adjacent thereto. Thus, to form a channel in each shield well region 315b1 and 315b2, an appropriate positive voltage needs to be applied to each shield electrode 335$b1$ and 335$b2$, respectively. While shield electrodes 335$b1$ and 335$b2$ are shown being insulated form one another, they can be extended in a dimension into the page and routed up and out of the trench where they can be electrically tied together. Alternatively, shield electrodes 335$b1$ and 335$b2$ can be tied to two different voltage sources.

FET 300C in FIG. 3C is similar to FET 300$b$ in FIG. 2C except that a total of four shield well regions 315$c11$, 315$c12$, 315$c21$, 315$c22$ are embedded in the drift region, two for each of two shield electrodes 335$c1$, 335$c2$. A total of five channels 317$c11$, 317$c12$, 317$c21$, 317$c22$, 327 are thus formed when FET 300C is turned on with proper positive voltages applied to each of the three electrodes 340, 335$c2$ and 335$c1$. As can be seen from the exemplary variations in FIGS. 3A-3C, many combinations and permutations of shield electrodes and shield well regions are possible, and as such the invention is not limited to the particular combinations shown and described herein.

Next, two exemplary process techniques for forming the FET structure similar to that in FIG. 2A will be described. Modifying these process techniques to arrive at the FET structure variations in FIGS. 3A-3C or other permutations and combinations of shield well regions and shield electrodes would be obvious to one skilled in the art in view of this disclosure.

Figure 4A:
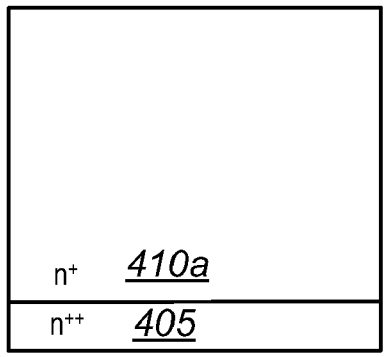
FIGS. 4A-4E are simplified cross-section views of a process for fabricating a dual channel shielded gate trench FET in accordance with an exemplary embodiment of the invention.

FIGS. 4A-4E are cross section views at various stages of a process for forming a dual channel shielded gate trench FET in accordance with an exemplary embodiment of the invention. In FIG. 4A, epitaxial region 410$a$ is formed over semiconductor substrate 405 using known techniques. Epitaxial region 410$a$ and semiconductor substrate 405 may be doped with an n-type dopant, such as, arsenic or phosphorous. In one embodiment, semiconductor substrate 405 is doped to a concentration in the range of $1\times10^{19}$–$1\times10^{21}$ cm$^{-3}$, and epitaxial region 410$a$ is doped to a concentration in the range of $1\times10^{18}$–$1\times10^{19}$ cm$^{-3}$.

Figure 4D:
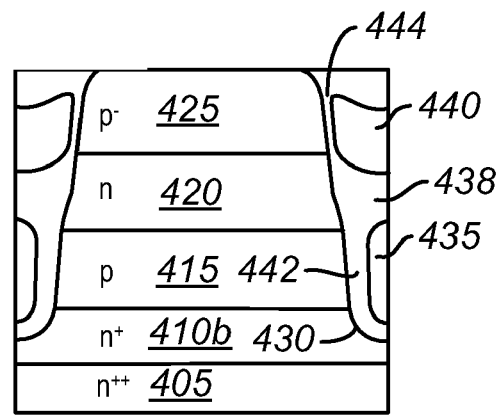
Figure 4B:
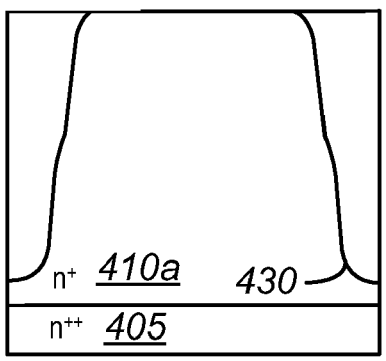

In FIG. 4B, trenches 430 are formed in epitaxial region 410$a$ using known silicon etch techniques. In an alternate embodiment, trenches 430 are etched deeper to terminate within substrate 405. In FIG. 4C, the various regions and layers in trenches 430 are formed using conventional techniques. Shield dielectric 442 (e.g., comprising one or both oxide and nitride layers) lining lower sidewalls and bottom of trenches 430 is formed using such known techniques as chemical vapor deposition (CVD) of silicon nitride, CVD oxide, or thermal oxidation of silicon. Shield electrode 435 (e.g., comprising doped or undoped polysilicon) is formed in a lower portion of each trench 430 using, for example, conventional polysilicon deposition and etch back techniques.

IED 438 (e.g., comprising thermal oxide and/or deposited oxide) is formed over shield electrode 435 using, for example, conventional thermal oxidation and/or oxide deposition techniques. Gate dielectric 444 (e.g., comprising oxide) lining upper trench sidewalls is formed using, for example, known thermal oxidation methods. Recessed gate electrode 440 is formed over IED 438 using, for example, conventional polysilicon deposition and etch back methods. While IED 438 is shown to be thicker than gate dielectric 444, in an alternate embodiment, they are formed simultaneously and thus have the same thickness. If additional shield electrodes are to be formed in trenches 430 (as in FIGS. 3B and 3C), the above process steps for forming the shield electrode and the IED can be repeated the requisite number of times.

In FIG. 4D, a first p-type well region 425 (gate well region) is formed in epitaxial layer 410$a$ by implanting and driving in p-type dopants in accordance with known techniques. In one embodiment, gate well region 425 may be doped with dopants, such as, Boron to a concentration in the range of $1\times10^{17}$–$1\times10^{18}$ cm$^{-3}$. A high energy implant of p-type dopants is then carried out to form a second p-type well region 415 (shield well region) deeper in epitaxial layer 410$a$ directly next to shield electrode 435 using known techniques. In one embodiment, shield well region 415 may be doped with dopants, such as, Boron to a concentration in the range of $1\times10^{16}$–$1\times10^{18}$ cm$^{-3}$.

The implant parameters for shield well region 435 need to be carefully selected to ensure that shield well region 415, upon completion of processing, is properly aligned with shield electrode 435 so that a channel can be formed therein when shield electrode 435 is biased in the on state. In the embodiments where multiple shield electrodes are formed in each trench, multiple shield well implants with different implant energies may be carried out to form multiple shield well regions, each being directly next to a corresponding shield electrode. Note that the implant for forming shield well region 415 is carried out after the implant for gate well region 425 in order to avoid out-diffusion of shield well region 415 during the gate well region 425 drive-in. However, with carefully controlled implant and drive-in processes, the order of the two implants may be reversed.

Figure 4E:
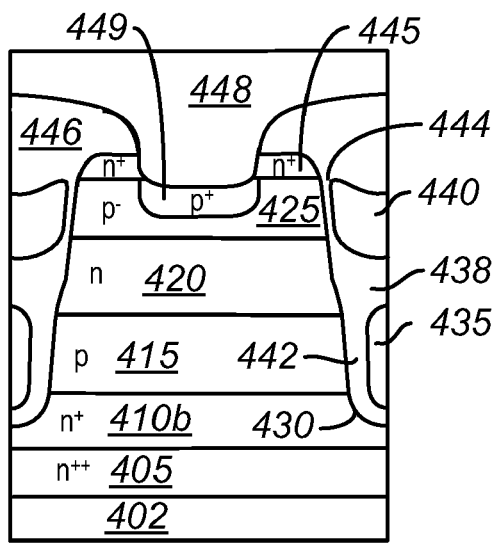
Figure 4C:
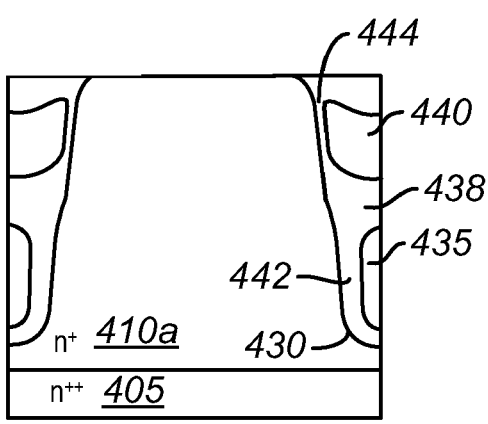

In FIG. 4E, a conventional source implant is carried out to form a highly doped n-type region laterally extending through an upper portion of gate well region 425 and abutting trenches 430. None of the implants up to this point in the process requires a mask layer, at least in the active region of the die. In one embodiment, a dielectric layer is formed over gate electrodes 440 prior to the three implants.

Dielectric caps 446 (e.g., comprising BPSG) extending over gate electrodes 440 and laterally overlapping the mesa regions adjacent trenches 430 are formed using known methods. Dielectric caps 446 thus form an opening over a middle portion of the mesa region between adjacent trenches. A conventional silicon etch is carried out to form a recess in the n-type region through the opening formed by dielectric caps 446. The recess extends to below a bottom surface of the n-type region and into gate well region 425. The recess thus breaks up the n-type region into two regions, forming source regions 445.

A conventional heavy body implant is carried out to form heavy body region 449 in body region 425 through the recess. A topside interconnect layer 448 is then formed over the structure using known techniques. Topside interconnect layer 448 extends into the recess to electrically contact source regions 445 and heavy body region 449. A backside interconnect layer 402 is formed on the backside of the wafer to electrically contact substrate 405. Note that the cell structure in FIG. 4E is typically repeated many times in a die in a closed cell or an open cell configuration.

Figure 5A:
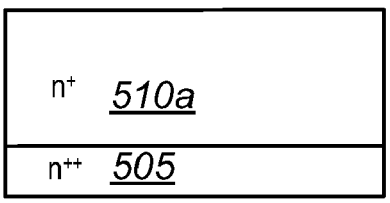
FIGS. 5A-5F are simplified cross-section views of another process for fabricating a dual channel shielded gate trench FET in accordance with an exemplary embodiment of the invention.
Figure 5B:
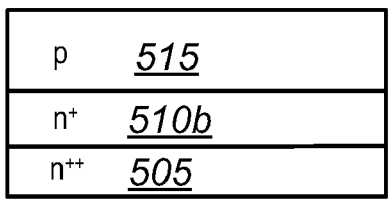

FIGS. 5A-5F depict an alternate process for forming a dual channel shielded gate trench FET in accordance with another exemplary embodiment of the invention. In FIG. 5A, similar to FIG. 4A, n-type epitaxial layer 510$a$ is formed over substrate 505 using known techniques. In FIG. 5B, p-type shield well region 515 is formed either by forming a p-type epitaxial layer over n-type epitaxial layer 510$a$ or by implanting p-type dopants into n-type epitaxial layer 510$a$ to convert an upper layer of epitaxial layer 510$a$ to p-type. Shield well region 515 may be capped with a thin layer of arsenic doped epi (not shown) to prevent up-diffusion of the dopants in shield well region 514 during subsequent heat cycles.

Figure 5C:
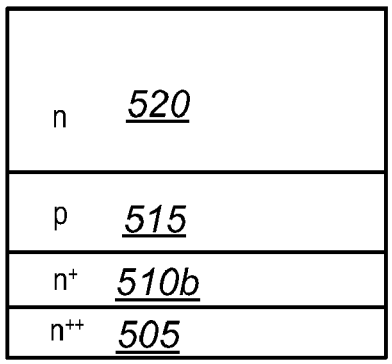
Figure 5D:
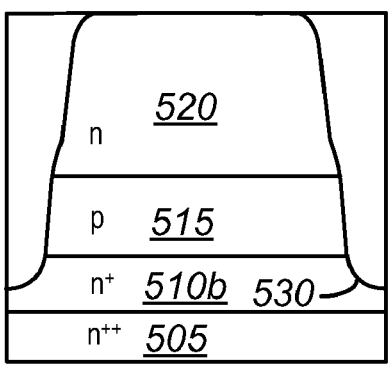
Figure 5E:
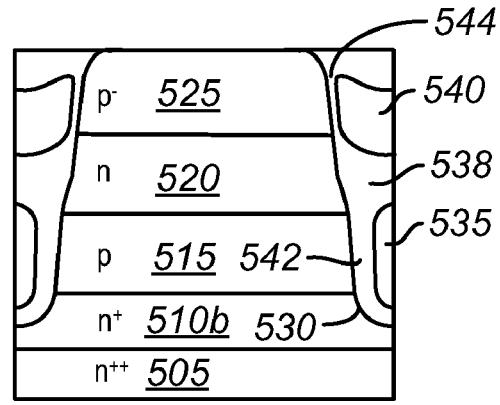

In FIG. 5C, n-type drift region 520 is formed by forming an n-type epitaxial layer over shield well region 510$a$. In FIG. 5D, using conventional techniques, trenches 530 are formed extending through the various semiconductor layers and terminating within bottom-most drift region 510b. Alternatively, trenches 530 may be extended deeper to terminate within substrate 505. In FIG. 5E, shield dielectric layer 442, shield electrode 435, IED 438, gate dielectric 444, and gate electrode 440 may be formed in trenches 530 in a similar manner to those described above in reference to FIG. 4C, and thus will not be described.

Figure 5F:
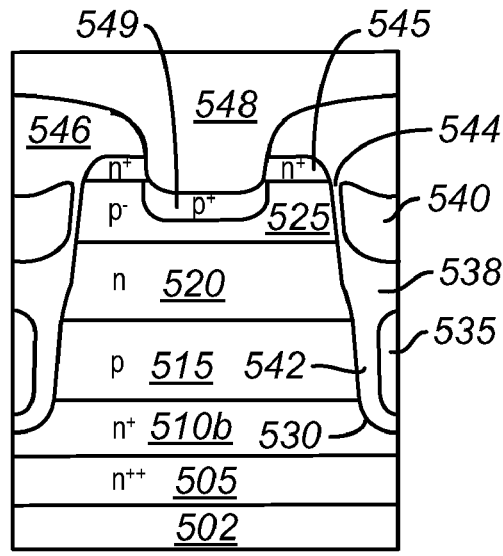

P-type gate well region 525 is formed next by implanting p-type dopants into n-type drift region 520 to thereby convert an upper layer of drift region 520 to p-type. In FIG. 5F, dielectric cap 546, source regions 545, heavy body region 549, topside interconnect layer 548 and backside interconnect layer 502 are all formed in a similar manner to those described above in reference to FIG. 4E and thus will be not described.

In accordance with embodiments of the invention, the one or more shield electrodes in the trenches may be biased in a number of different ways. For example, the one or more shield electrodes may be biased to a constant positive voltage, may be tied to the gate electrode (so that the shield and gate electrodes switch together), or may be tied to a switching voltage independent of the gate voltage. The means for biasing of the one or more shield electrodes may be provided externally or generated internally, for example, from available supply voltages. In the embodiments where the shield electrode is biased independent of the gate electrode biasing, some flexibility is obtained in terms of optimizing various structural and electrical features of the FET.

In one embodiment where the gate electrode is switched between 20V (on) and 0V (off), the shield electrode is switched between 20V (on) and 10V (off). This limits the maximum voltage across IED 238 (FIG. 2A) to 10V, thus allowing a relatively thin IED to be formed. Simulation results for this embodiment show a 45% improvement in Rdson, a BVdss of about 30V, and a substantially low gate charge Qg. In another embodiment where gate electrode 240a is switched between 20V (on) and 0V (off), shield electrode 235a is biased to 20V during both the on and off states. Simulation results for this embodiment have shown a 25% improvement in Rdson, a BVdss of about 30V, and a substantially low Qg.

Thus, the desired operational voltages to be applied to gate electrode 240a and shield electrode 235a determine the thickness and quality of IED 238. In the embodiments where a smaller voltage differential appears across IED 238 (FIG. 2A), a thinner IED 238 may be formed which advantageously enables forming a thinner upper drift region 220 thus obtaining a lower Rdson. A further reduction in Rdson is obtained by the virtue of forming a second channel along each trench sidewall. These and other advantages and features of the various embodiments of the invention are described more fully with reference to the simulation results shown in FIGS. 6-9.

Figure 1:
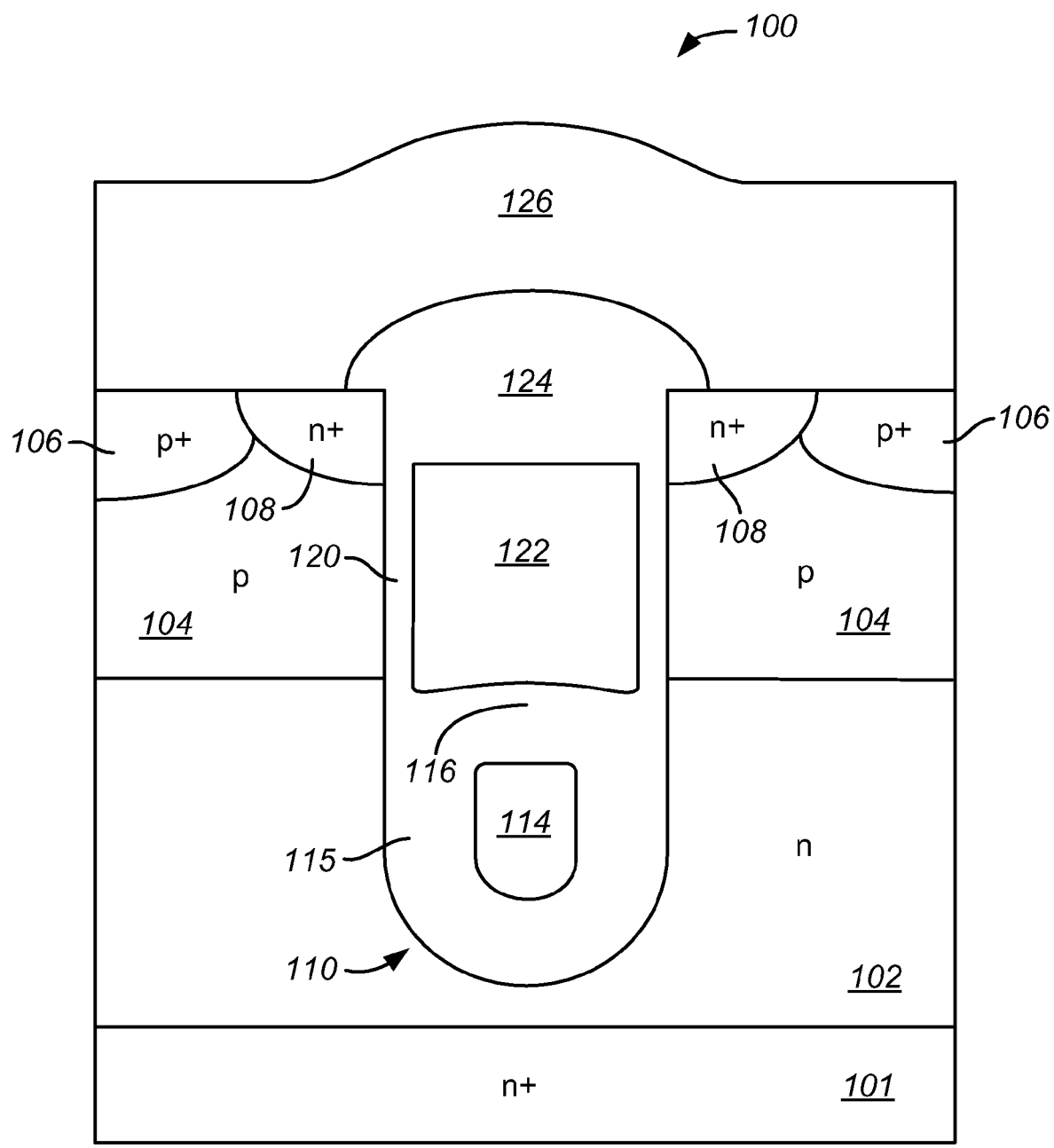
FIG. 1 is a simplified cross-section view of a conventional shielded gate MOSFET.
Figure 6:
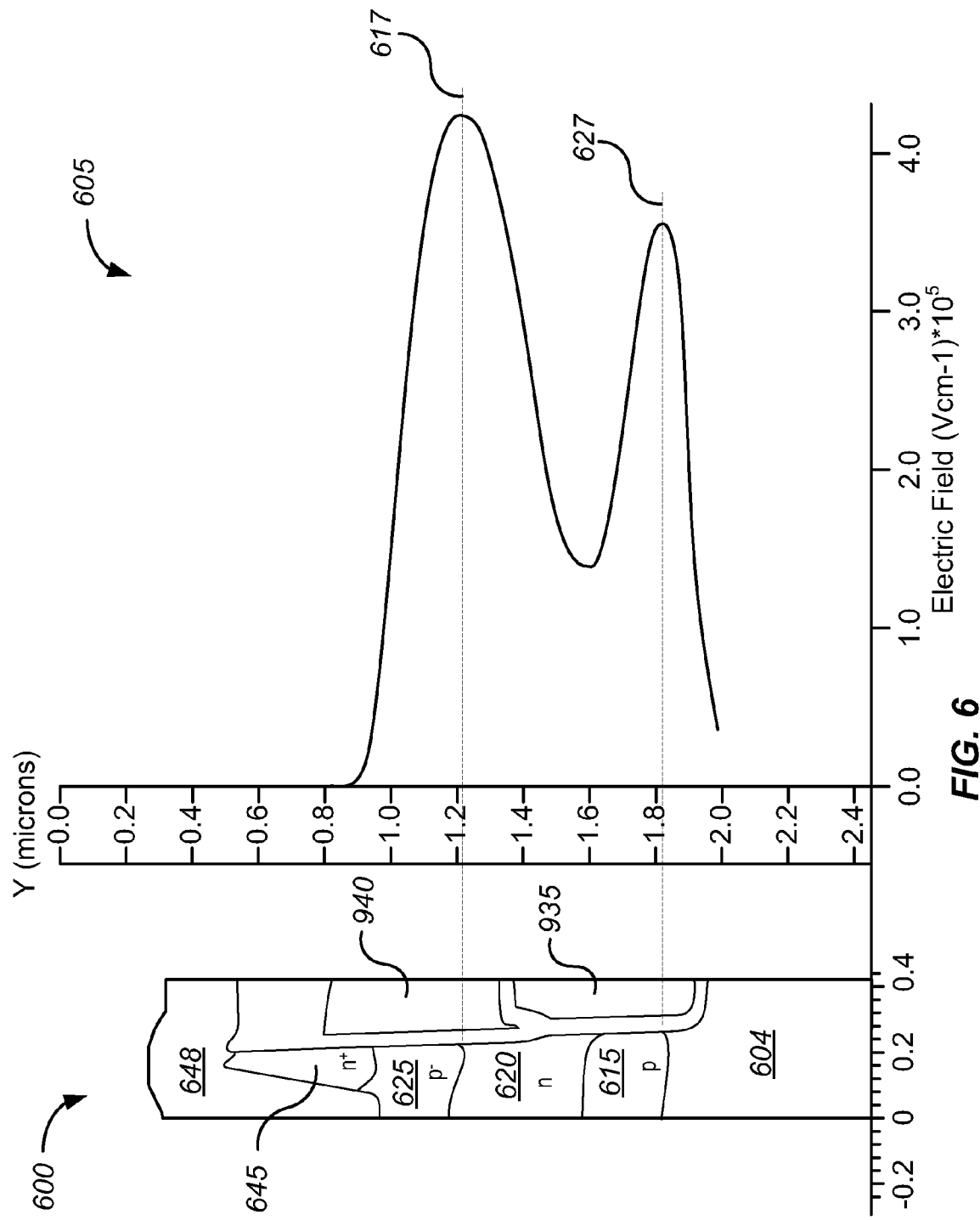
FIG. 6 is a plot of simulation results showing the electric field profile along the depth of a dual channel shielded gate FET.

FIG. 6 is a plot of simulation results showing the electric field profile along the depth a dual channel shielded gate FET 600. As shown, two electric field peaks occur at locations 617 and 627 corresponding to the pn junctions formed by each of well regions 625 and 615 and their underlying drift regions 620 and 604, respectively. In contrast, in conventional single channel shielded gate FETs such as FET 100 in FIG. 1, only one peak occurs at the pn junction between well region 104 and its underlying drift region. Thus, the dual channel FET structure 600 advantageously increases the area under the electric field curve which increases the transistor breakdown voltage. It can be seen that upon embedding additional shield well regions in the drift region, additional peaks would be induced in the electric field profile thus further increasing the transistor breakdown voltage. The improvement in breakdown voltage enables increasing the doping concentration in drift regions 604 and 620 thereby reducing the Rdson. That is, for the same breakdown voltage as the prior art FET, a higher Rdson can be obtained.

Figure 7:
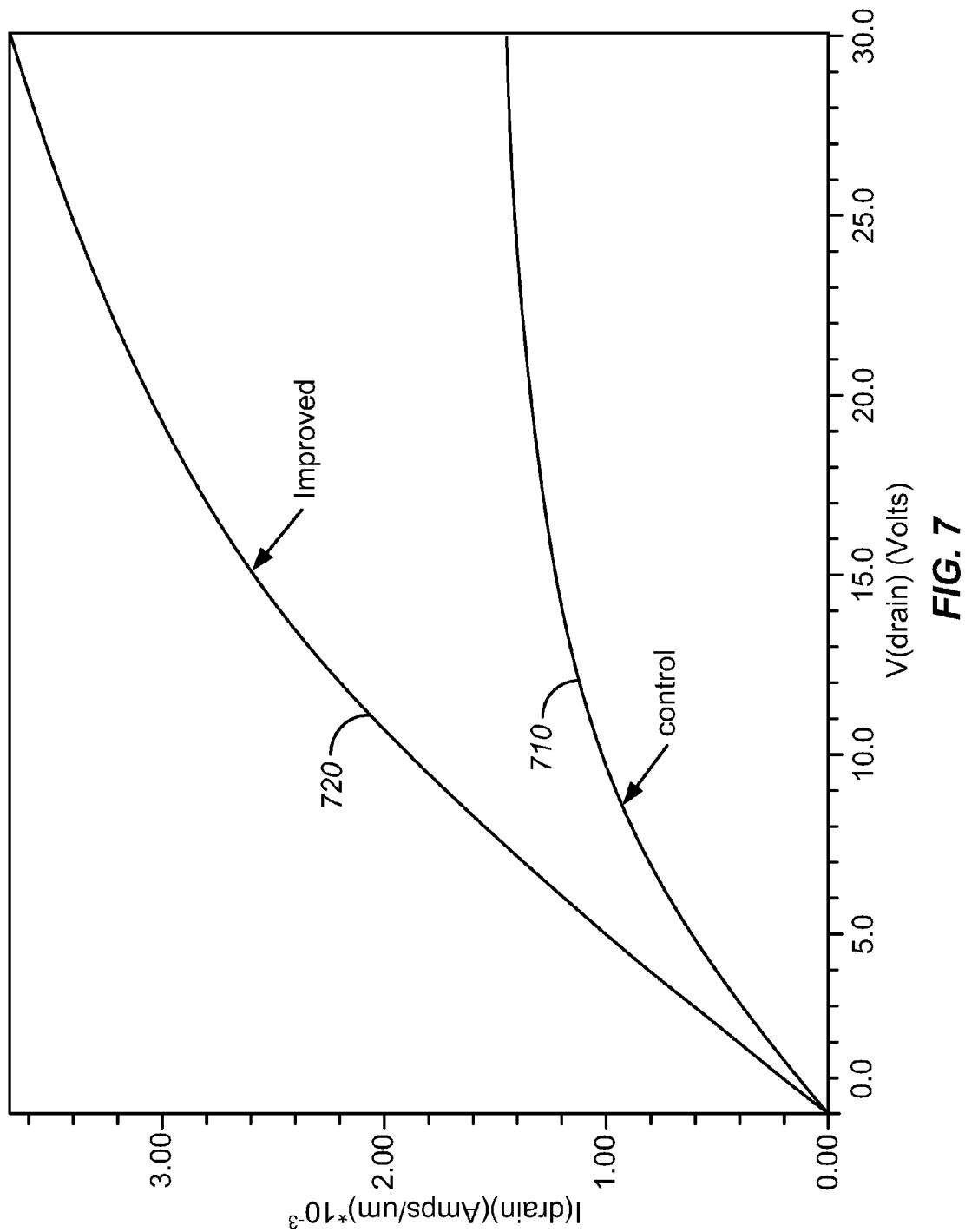
FIG. 7 is a plot of simulation results showing the drain current versus the drain voltage for each of a conventional shielded gate FET and a dual channel shielded gate FET.

FIG. 7 is a plot of simulation results showing the drain current versus the drain voltage for each of a conventional shielded gate FET (curve 610 marked as "control") and a dual channel shielded gate FET (curve 620 marked as "improved"). As is readily apparent, a significant increase in the drain current is realized by the dual channel shielded gate FET.

Figure 8:
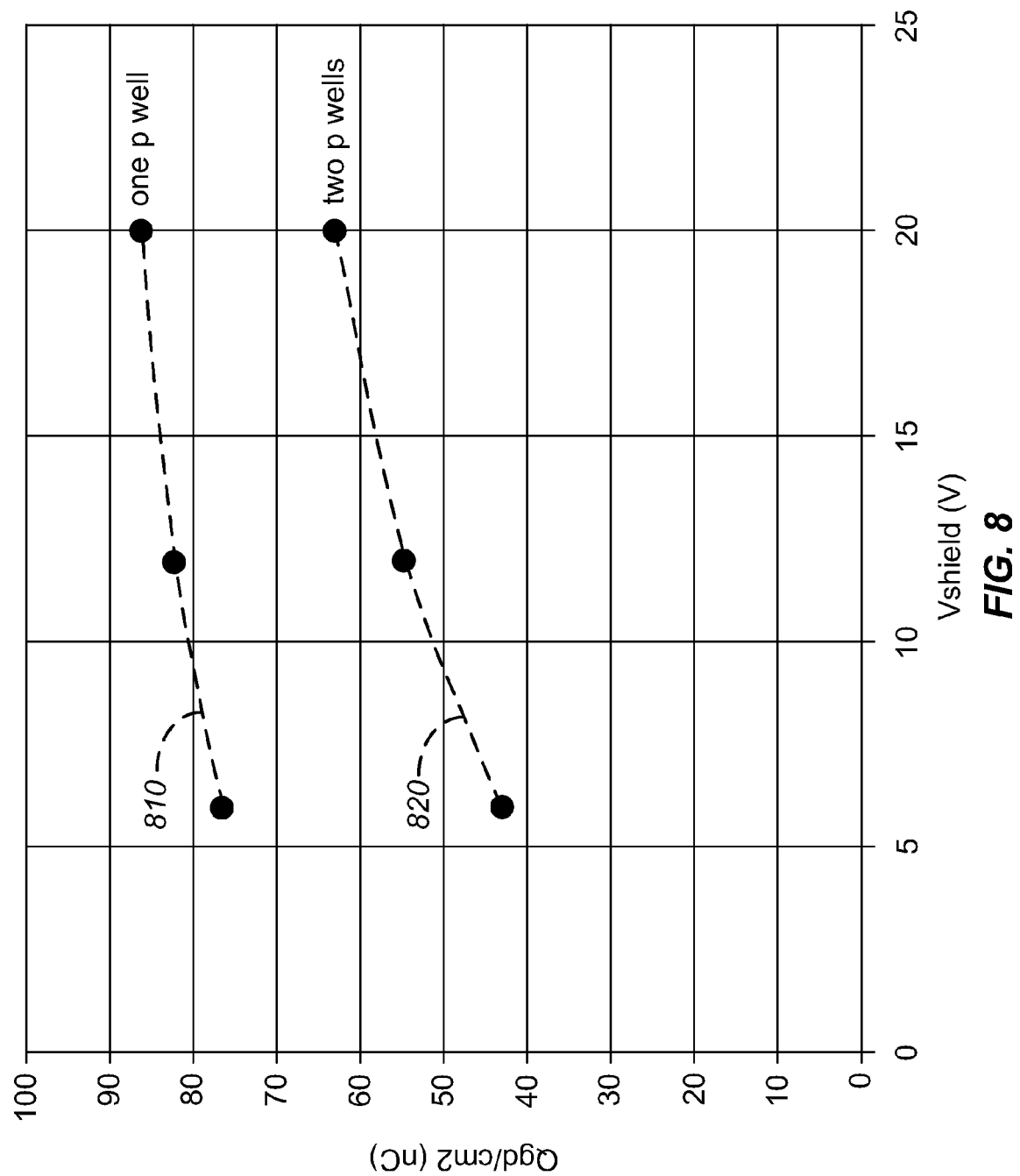
FIG. 8 is a plot of simulation results showing the gate-drain charge Qgd versus the voltage on the shield electrode for a conventional shielded gate FET and a dual channel shielded gate FET.

In the conventional shielded gate FETs, the depletion charges in the lightly doped drift region is a significant contributor to Qgd. However, in the multi-channel shielded gate FET in accordance with the invention, the impact of charges in the drift region on Qgd is substantially minimized because the positive charges in the multiple drift regions are compensated by the negative charges in their adjacent multiple well regions. FIG. 8 is plot of simulation results showing the gate-drain charge Qgd versus the voltage on the shield electrode for each of a conventional shielded gate FET (curve 810) versus a dual channel shielded gate FET (curve 820). A bias voltage applied to shield electrode 235a (FIG. 2A) is varied from about 6-20V and Qgd is measured. As is apparent, a significant reduction in the gate-drain capacitance $C_{gd}$ (approximately 40% reduction at low shield bias) is realized by the dual channel shielded gate FET.

Figure 9:
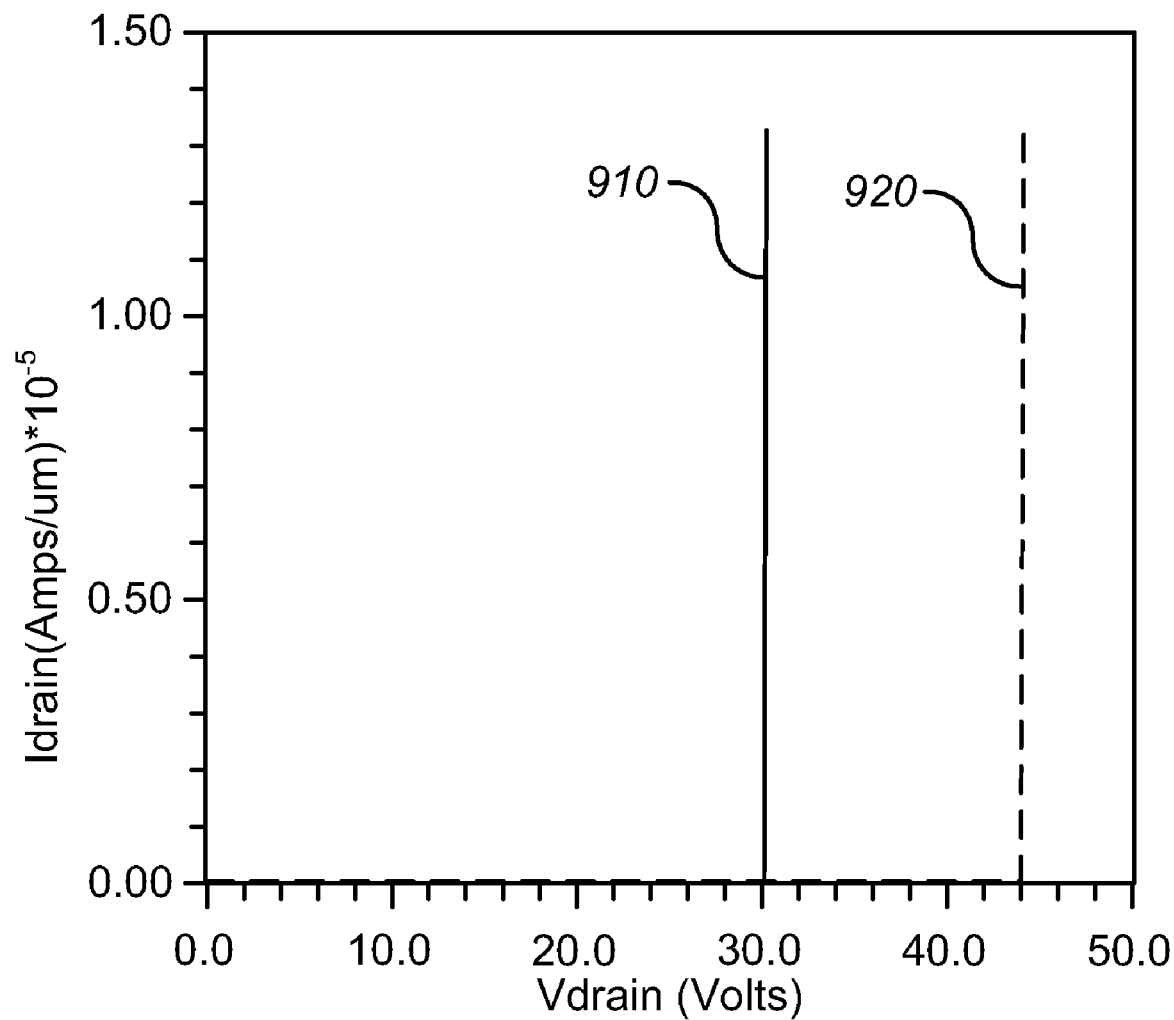
FIG. 9 is a plot of simulation results showing the drain-source breakdown voltage BVdss for a conventional shielded gate FET versus a dual channel shielded gate FET.

FIG. 9 is another plot of simulation results showing the drain-source breakdown voltage $BV_{dss}$ for each of a conventional shielded gate FET (curve 910) and a dual channel shielded gate FET (curve 920). As can be seen, a significant increase in $BV_{dss}$ is realized by the dual channel shielded gate FET. This provides additional flexibility in adjusting the thickness of various dielectric layers in the trench to improve other characteristics of the FET.

A further feature of the multiple well shielded gate FETs is the improved UIS and snap back characteristics. The multiple well regions result in formation of a number of back to back connected pn diodes which function similar to the well-known multiple ring zener structure that provides superior UIS and snap back characteristics.

Thus, as can be seen, with relatively minimal changes to the manufacturing process (e.g., adding s shield well implant), the multiple channel shielded gate FET in accordance with embodiments of the invention improves various performance characteristics of the transistor without adversely impacting its other characteristics. As set forth above, the improvements that are achieved include lower Rdson, lower gate charge, higher BVdss, and improved UIS and snap back characteristic.

While the above provides a complete description of various embodiments of the invention, many alternatives, modifications, and equivalents are possible. For example, various embodiments of the invention have been described in the context of n-channel shielded gate MOSFETs, however the invention is not limited only to such FETs. For example, p-channel counterparts of the various shielded gate MOSFETs shown and described herein may be formed by merely reversing the conductivity type of the various semiconductor regions. As another example, n-channel IGBT counterparts of the MOSFETs described herein may be formed by merely reversing the conductivity type of the substrate, and p-channel IGBT counterparts may be formed by reversing the conductivity type of the various semiconductor regions except for the substrate. Further, although implantation has generally been used in the exemplary embodiments to form doped regions, one skilled in the art would recognize that other means for forming doping regions, such as diffusion, could be substituted or combined with the implantation steps described herein. Therefore, the above description should not be taken as limiting the scope of the invention, which is defined by the appended claims.

What is claimed is:

1. A field effect transistor (FET) comprising:
   a pair of trenches extending into a semiconductor region;
   a first shield electrode in a lower portion of each trench;
   a gate electrode in an upper portion of each trench over but insulated from the shield electrode by an inter-electrode dielectric; and
   first and second well regions of a first conductivity type laterally extending in the semiconductor region between the pair of trenches, each of the first and second well regions abutting sidewalls of the pair of trenches, the first and second well regions being vertically spaced from one another by a first drift region of a second conductivity type,
   wherein the gate electrode and the first shield electrode are positioned relative to the first and second well regions such that a channel is formed in each of the first and second well regions when the FET is biased in the on state.

2. The FET of claim 1 wherein when the FET is biased in the on state, two separate channels are formed along portions of each trench sidewall where the first and second well regions abut.

3. The FET of claim 1 wherein the first well region is laterally adjacent to the gate electrode in each trench, and the second well region is laterally adjacent to the first shield electrode in each trench.

4. The FET of claim 1 further comprising:
   a shield dielectric lining lower sidewalls and bottom of each trench;
   a gate dielectric lining upper sidewalls of each trench;
   source regions of the second conductivity type flanking upper sidewalls of each trench; and
   a heavy body region of the first conductivity type extending in the first well region.

5. The FET of claim 1 wherein the first well region is above the second well region, the FET further comprising a third well region of the first conductivity type laterally extending in the semiconductor region between the pair of trenches, the third well region abutting sidewalls of the pair of trenches, the third well region being vertically spaced from the second well region by a second drift region of the second conductivity type.

6. The FET of claim 5 wherein the gate and first shield electrodes are positioned relative to the first, second and third well regions such that a channel is formed in each of the first, second and third well regions when the FET is biased in the on state.

7. The FET of claim 5 wherein when the FET is biased in the on state, three separate channels are formed along portions of each trench sidewall where the first, second and third well regions abut.

8. The FET of claim 5 wherein the first well region is laterally adjacent to the gate electrode in each trench, and the second and third well regions are laterally adjacent to the first shield electrode in each trench.

9. The FET of claim 1 wherein the first well region is above the second well region, the FET further comprising:
   a third well region of the first conductivity type laterally extending in the semiconductor region between the pair of trenches, the third well region abutting sidewalls of the pair of trenches, the third well region being vertically spaced from the second well region by a second drift region of the second conductivity type; and
   a second shield electrode in the trench below the first shield electrode, the first and second shield electrodes being insulated from one another.

10. The FET of claim 9 wherein the gate electrode, the first shield electrode and the second shield electrode are positioned relative to the first, second and third well regions such that a channel is formed in each of the first, second and third well regions when the FET is biased in the on state.

11. The FET of claim 9 wherein when the FET is biased in the on state, three separate channels are formed along portions of each trench sidewall where the first, second and third well regions abut.

12. The FET of claim 9 wherein the first well region is laterally adjacent to the gate electrode in each trench, the second well region is laterally adjacent to the first shield electrode in each trench, and the third well region is next adjacent next to the second shield electrode in each trench.

13. A field effect transistor (FET) comprising:
   a stack of, from the top to bottom, a first well region of a first conductivity type, a first drift region of a second conductivity type, a second well region of the first conductivity type, and a second drift region of the second conductivity type, laterally extending between and abutting sidewalls of two trenches, each trench having a stack of, from the top to bottom, a gate electrode and a first shield electrode insulated from one another by an inter-electrode dielectric,
   wherein the gate electrode and the first shield electrode are positioned relative to the first and second well regions such that a channel is formed in each of the first and second well regions when the FET is biased in the on state.

14. The FET of claim 13 wherein when the FET is biased in the on state, two separate channels are formed along portions of each trench sidewall where the first and second well regions abut.

15. The FET of claim 13 wherein the first well region is laterally adjacent to the gate electrode in each trench, and the second well region is laterally adjacent to the first shield electrode in each trench.

16. The FET of claim 13 further comprising:
   a shield dielectric lining lower sidewalls and bottom of each trench;
   a gate dielectric lining upper sidewalls of each trench;
   source regions of the second conductivity type flanking upper sidewalls of each trench; and
   a heavy body region of the first conductivity type extending in the first well region.

17. The FET of claim 13 further comprising a third well region of the first conductivity type laterally extending between and abutting the two trenches, the third well region extending below the second drift region.

18. The FET of claim 17 wherein when the FET is biased in the on state, three separate channels are formed along portions of each trench sidewall where the first, second and third well regions abut.

19. The FET of claim 17 wherein the first well region is laterally adjacent to the gate electrode in each trench, and the second and third well regions are laterally adjacent to the first shield electrode in each trench.

20. The FET of claim 13 further comprising:
a third well region of the first conductivity type laterally extending between and abutting the two trenches, the third well region extending below the second drift region; and
a second shield electrode in the trench below the first shield electrode, the first and second shield electrodes being insulated from one another.

21. The FET of claim 20 wherein when the FET is biased in the on state, three separate channels are formed along portions of each trench sidewall where the first, second and third well regions abut.

22. The FET of claim 20 wherein the first well region is laterally adjacent to the gate electrode in each trench, the second well region is laterally adjacent to the first shield electrode in each trench, and the third well region is laterally adjacent to the second shield electrode in each trench.

* * * * *